United States Patent
Kwan et al.

(10) Patent No.: US 9,009,552 B2
(45) Date of Patent: Apr. 14, 2015

(54) SCAN-BASED RESET

(75) Inventors: Bill K. Kwan, Austin, TX (US);
Atchyuth K. Gorti, Austin, TX (US);
Amit Raj Pandey, Austin, TX (US);
Venkat K Kuchipudi, Austin, TX (US);
Aditya Jagirdar, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 597 days.

(21) Appl. No.: 12/878,693

(22) Filed: Sep. 9, 2010

(65) Prior Publication Data

US 2012/0062283 A1   Mar. 15, 2012

(51) Int. Cl.
*G01R 31/28* (2006.01)
*G01R 31/3185* (2006.01)

(52) U.S. Cl.
CPC ................. *G01R 31/318575* (2013.01)

(58) Field of Classification Search
CPC ............. G01R 31/318575; G01R 31/318385; G01R 31/318544; G01R 31/318583
USPC ................... 714/724, 726, 727; 327/143, 198
See application file for complete search history.

(56) References Cited

U.S. PATENT DOCUMENTS

| | | | | |
|---|---|---|---|---|
| 6,553,496 | B1 * | 4/2003 | Buer ................................. 726/34 |
| 7,024,605 | B2 * | 4/2006 | Sera et al. ...................... 714/726 |
| 7,028,239 | B2 * | 4/2006 | Jaber .............................. 714/733 |
| 7,111,217 | B1 * | 9/2006 | Schultz .......................... 714/727 |
| 7,185,244 | B2 * | 2/2007 | Kojima et al. ................. 714/718 |
| 7,290,191 | B2 * | 10/2007 | Grise et al. ..................... 714/726 |
| 7,469,372 | B2 * | 12/2008 | Nardini et al. ................. 714/726 |
| 7,688,930 | B2 * | 3/2010 | Beattie et al. ................. 375/376 |
| 7,725,788 | B2 * | 5/2010 | Tkacik et al. ................. 714/726 |
| 7,962,819 | B2 * | 6/2011 | Liu et al. ....................... 714/731 |
| 8,037,382 | B2 * | 10/2011 | Gunasekar ..................... 714/726 |
| 2008/0115025 | A1 * | 5/2008 | Frederick ...................... 714/732 |

OTHER PUBLICATIONS

Fan Yang; Chakravarty, S.; Devta-Prasanna, N.; Reddy, S.M.; Pomeranz, I, "Detection of Transistor Stuck-Open Faults in Asynchronous Inputs of Scan Cells," Defect and Fault Tolerance of VLSI Systems, 2008. DFTVS '08. IEEE International Symposium on , vol., No., pp. 394,402, Oct. 1-3, 2008.*

Higami, Y.; Takahashi, H.; Kobayashi, S.; Saluja, K.K., "Diagnosis for Bridging Faults on Clock Lines," Dependable Computing (PRDC), 2012 IEEE 18th Pacific Rim International Symposium on , vol., No., pp. 135,144, Nov. 18-19, 2012.*

* cited by examiner

*Primary Examiner* — Cynthia Britt

(57) ABSTRACT

Scan-based reset utilizes already existing design-for-test scan chains to reset control and logic circuitry upon reset conditions, such as power-up reset. Such utilization eliminates the need for expensive, high fan-out reset trees and per scan cell reset control logic, thus reducing chip area and power consumption. Additional power savings is achieved by controlling clock frequency during reset conditions. Limiting scan cell chain length and providing multiple chains reduces reset latency.

22 Claims, 6 Drawing Sheets

SCAN-BASED RESET

BACKGROUND OF THE INVENTION

1. Field of the Invention

Generally, the present disclosure relates to integrated circuits, and, more particularly, to the use of design-for-test elements for resetting core logic to a known state.

2. Description of the Related Art

Design-for-Testability (DFT) is a technique that enhances a microcircuit's testability by incorporating certain features into the microcircuit's design to facilitate testing of the manufactured product. The goal of such a design is to make difficult-to-test sequential circuits easier to test by replacing traditional sequential elements, such as flip flops (hereinafter called flops) with scannable sequential elements, called scan cells, and then connecting the scan cells together to form scan chains. A scan cell is a normal latch or flip-flop with an additional input, called the scan input, and an additional output, called the scan output. The scan output of one scan cell connects to the scan input of the next scan cell to form a scan chain. You can then shift data serially into and out of the scannable elements to inject test patterns into, or receive test results from, a manufactured chip during testing. The injected data appears at the outputs of the microcircuit's scannable sequential elements during operation.

Typically, each scannable sequential element is part of the functional core logic of the microcircuit's design, and each may need to be reset during reset conditions, such as a power-on reset condition. In a traditional microcircuit design, each scannable flop contains set or reset logic that is connected to a reset tree for setting the flop to a known state upon the reset condition. However, microcircuits may contain large numbers of such flops, resulting in reset trees and per-flop reset logic that require large amounts of area. Furthermore, because reset trees typically operate at full functional clock speeds, they also consume additional power and present timing challenges.

SUMMARY OF EMBODIMENTS OF THE INVENTION

The apparatuses, systems, and methods in accordance with the embodiments of the present invention eliminate the need for high fan-out reset trees and the per-flop set or reset circuitry in microcircuit designs. A system reset is accomplished by shifting reset data through the already existing scan circuitry upon a reset condition. A reset condition typically occurs during the powering-up of a microcircuit device but can occur during other conditions as well, such as after a built-in self-test (BIST). One example of a BIST is a memory built-in self-test (MBIST). Self-tests typically leave scan cells in a state that is not suitable for normal system operation. Reset control circuitry may be configured to sense these conditions and initiate resetting of the device to a proper state before beginning or continuing microcircuit operation.

Another aspect of an embodiment of the invention is controlling clock speeds when a reset condition is asserted. Scannable sequential elements configured to form a scan path are typically optimized for slower clock frequencies than the normal functional logic. When sensing a reset condition, control logic may include clock control circuitry to control the ramping down of a system clock to a proper frequency and then return the system clock to its normal frequency upon completion of the reset sequence. Conventional clock control methods can be used, such as by dividing the system clock.

Still another aspect of an embodiment of the invention is control of reset latency. Reset latency is the time it takes to complete a reset of the functional logic. When using scan-based reset of the present invention, scan paths having longer scan chains will take longer to reset than scan paths having shorter chains because reset data is shifted through the scan path serially. A scan chain of 500 cells, for example, needs 500 clock pulses before completing a system reset, whereas a scan chain of 300 cells needs only 300 pulses. Reset latency is managed by limiting the size of the scan chains and using multiple chains where needed.

In accordance with an embodiment of the invention, scan cells coupled to combinational logic are connected into one or more scan chains and are formed using any suitable method of manufacture, such as by growing or by deposition, without reset or set circuitry, or without being connected to a reset tree. The scan input of the first scannable element of each scan chain is connected to a data circuit which supplies reset data to each chain. In one embodiment, the data circuit may comprise connecting the scan input of the first scan cell of each scan chain to a logic zero or a logic 1. Control circuitry configured to sense a reset condition is coupled to the scan enable inputs of each scan cell and controls the shifting in of the reset data into each chain upon sensing the reset condition. The embodiment may include a clock control circuit configured to adjust a system clock to select an optimized clocking frequency for the reset sequence and to return the system clock to its previous speed upon completion of the reset sequence.

A method in accordance with another embodiment of the invention includes coupling two or more scannable sequential elements together to form a scan chain, wherein the scannable sequential elements are formed without reset or set circuitry or without being connected to a reset tree; coupling a data circuit to the scan input circuit of the first scan cell of the scan chain, the data circuit configured to supply reset data in response to a reset condition; and coupling a control circuit to the scan chain, wherein the control circuit is configured to sense a reset condition and to control the shifting in of reset data into the scan chain upon sensing the reset condition. The embodiment may further include coupling a clock control circuit to the scan chain, wherein the clock control circuit is configured to adjust the frequency of a clock supplied to the scan chain for shifting the reset data into the chain during the reset condition.

A method in accordance with still another embodiment of the invention includes sensing a reset condition in a semiconductor device and shifting reset data through at least one scan chain of the semiconductor device in response to the reset condition. The reset condition may be a power-on reset condition or the completion of a BIST.

The invention described herein may be used in any type of integrated circuit that uses scannable sequential elements, such as a microprocessor. General purpose microprocessors, for example, typically perform basic arithmetic operations, move data from one memory location to another, and make basic decisions based on the quantity of certain values contained in registers or memory. Control elements within the microprocessor determine its current state and the operations performed by the microprocessor. The microprocessor's control elements may be designed using scannable sequential elements that are configured into one or more scan chains. During a reset condition, such as a power-on reset, the control elements may be initialized to a known state automatically by shifting in reset data into the one or more scan chains. Once initialized, the microprocessor begins operation in a known state. The microprocessor's scannable sequential elements may be reset without connecting them to expansive reset trees or forming set or reset circuits in the scannable sequential elements.

BRIEF DESCRIPTION OF THE FIGURES

The disclosed subject matter will hereafter be described with reference to the accompanying drawings, wherein like reference numerals denote like elements, and.

Figure 1:
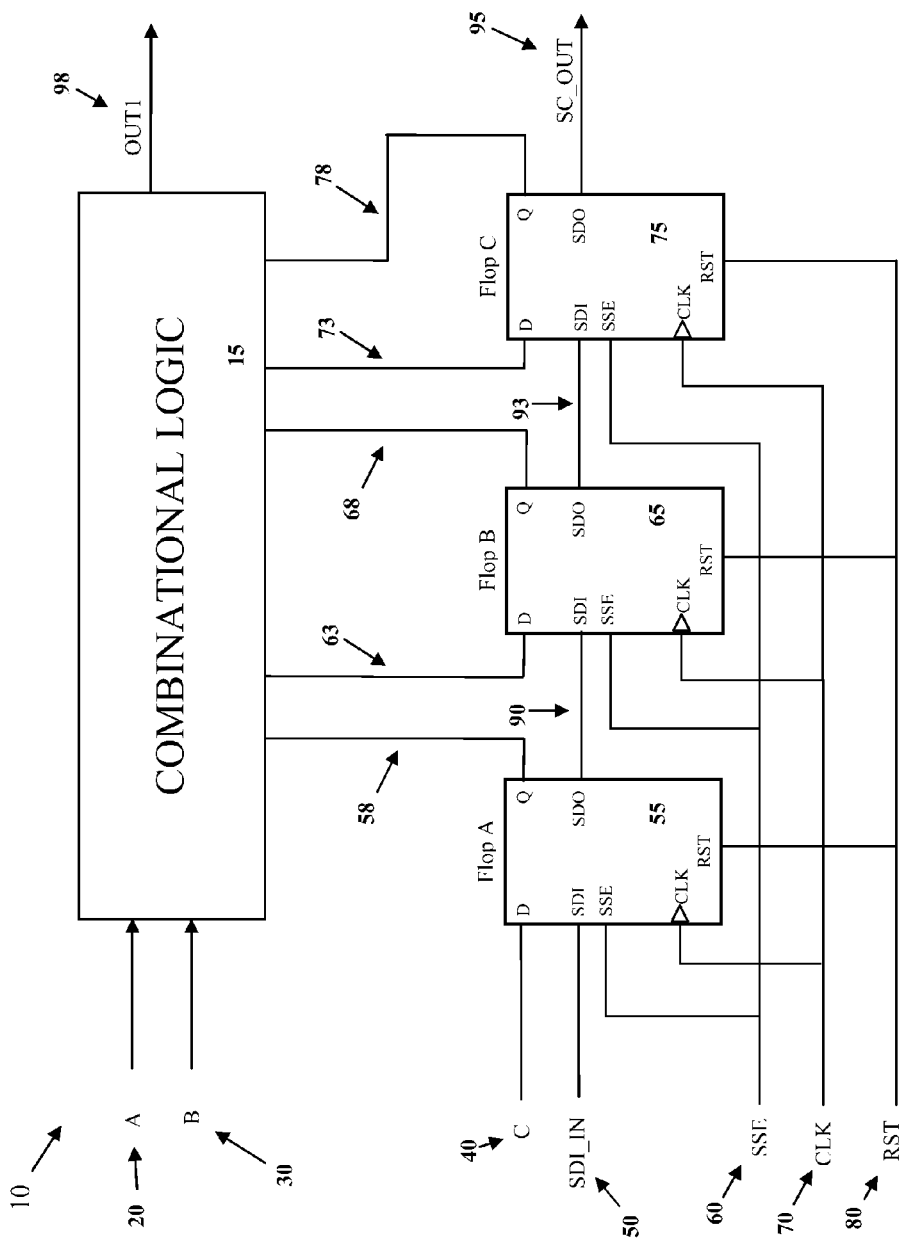
FIG. 1 is a simplified schematic diagram of an exemplary microcircuit design utilizing scannable sequential elements in the form of mux-d flops typically found in the prior art.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

FIG. 1 is a simplified schematic diagram of an exemplary microcircuit design utilizing scannable sequential elements (in the form of mux-d flops) of the kind typically found in the prior art. The microcircuit receives seven inputs, A 20, B 30, C 40, SDI_IN 50, SSE 60, CLK 70, and RST 80, and sources two outputs, OUT1 98 and SC_OUT 95. Inputs A 20, B 30, and C 40 are supplied to the functional logic 15 for processing, and the intermediate results are clocked into flops 55, 65, and 75 with the rising edge of CLK 70. The scannable elements 55, 65, and 75 each comprise a scan cell, having, in addition to the D input and Q output, one scan input (50, 90, and 93, respectively) and one scan output (90, 93, and 95, respectively). The scan output of one cell connects to the scan input of the next cell, forming a scan chain. The scan enable signal (SSE 60) supplied to each cell determines whether the input to the cell is received from the cell's D input signal or from the scan input signal, with a logic high selecting the scan input signal. When the CLK 70 is sourced, the Q (58, 68, and 78) and SDO (90, 93, and 95) outputs of each cell, respectively, latch to the logic value of their corresponding D or scan input lines, depending on the state of scan enable signal.

Such a configuration facilitates testing of the microcircuit. When the combinational logic 15 is large and complex, such as in a microprocessor design, it is desirable to have many scan cells serially connected in the manner described in FIG. 1 to form one or more scan chains. Test patterns can then be serially shifted into the scan chains via the scan input pin of the first scan cell (e.g., SDI_IN 50) by activating the scan enable signal SSE 60 and cycling CLK 70. Once the pattern has been injected into the scan chain, the functional path can be re-enabled by deactivating the scan enable signal and allowing the system clock (CLK 70) to cycle for the desired number of times. The results can then be shifted out of the scan chain through SC_OUT 95 in the same manner as the test pattern was shifted in.

Figure 2:
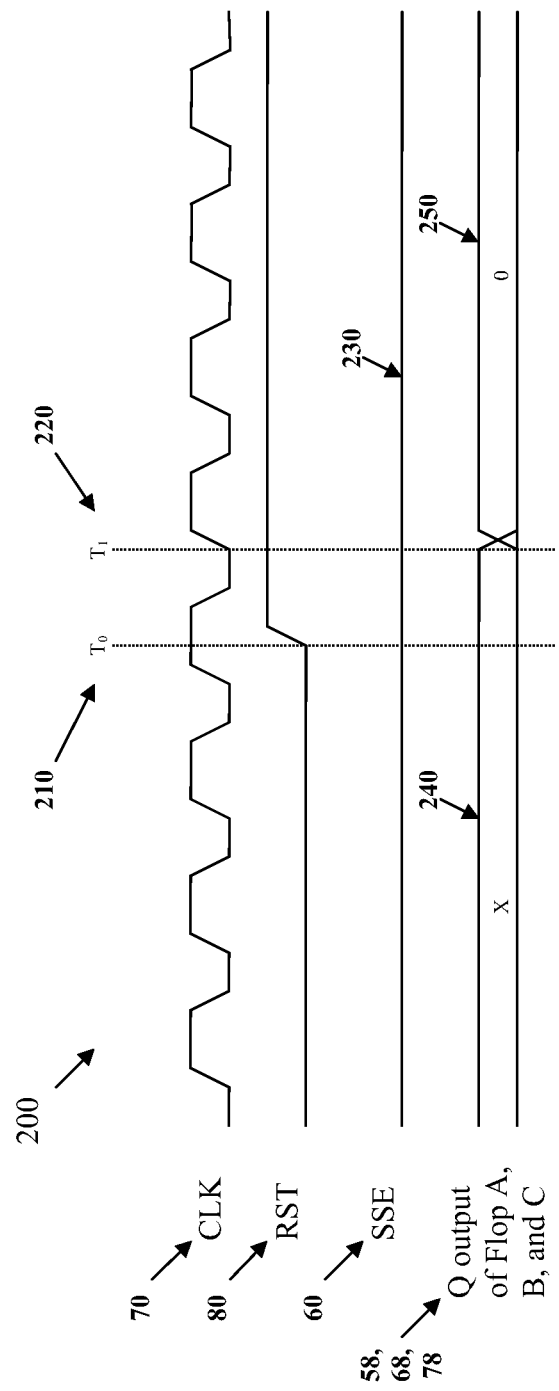
FIG. 2 is a simplified timing diagram showing a typical reset sequence of the scannable elements of FIG. 1 upon a reset condition, such as a power-on reset.

Because the scan cells form part of the functional logic of the microcircuit, the scan cells typically must be reset during reset conditions, such as a power-on reset condition. FIG. 2 illustrates a typical reset sequence for the microcircuit of FIG. 1. Per the figure, RST 80 is activated at time $T_0$ 210 while CLK 70 is cycling. After one clock cycle, the corresponding outputs of each flop 58, 68, and 78 reset to a known logic state, logic 0 250 in this case, as shown at $T_1$ 220. In other designs, the scannable elements may have a set circuit rather than a reset circuit, with the RST 80 signal connected thereto, resulting in the respective flop resetting to a logic 1 rather than 0, or they may have no set or reset circuit at all. The techniques described herein can eliminate the reset trees and the per-flop set and reset circuits altogether by utilizing the already existing scan chains to initialize the microcircuit upon a reset condition. A design in accordance with these techniques, called scan-based reset, is illustrated in FIG. 3.

Figure 3:
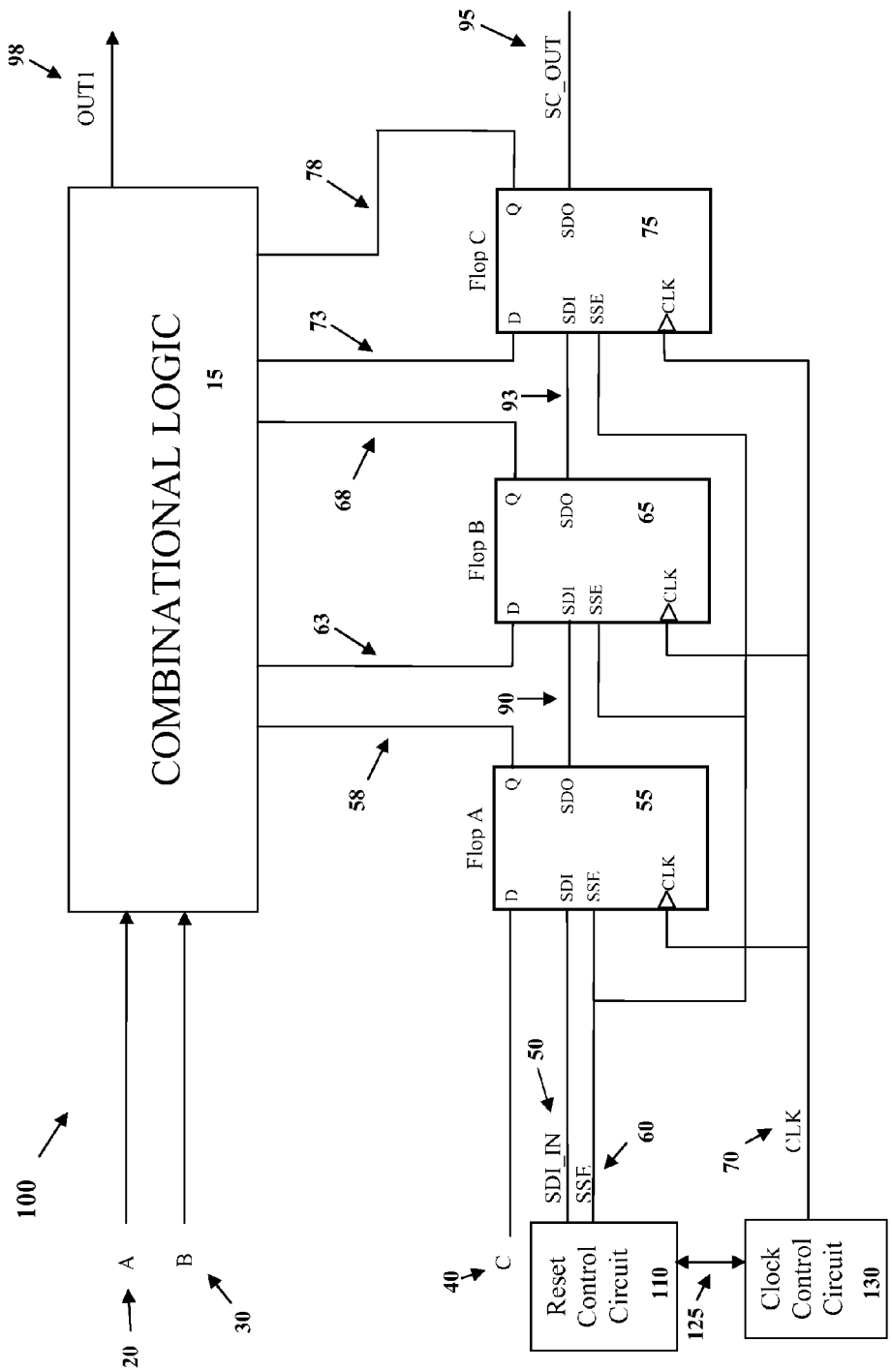
FIG. 3 is a simplified schematic diagram of a microcircuit design utilizing scannable sequential elements in the form of mux-d flops in accordance with an embodiment of the invention.

In FIG. 3, flops 55, 65, and 75 are designed without set or reset circuits and a reset control circuit 110 sources SDI_IN 50 and SSE 60 signals to the scan chain in a manner that does not interfere with the normal scan test controls. The control circuitry 110 may also contain a data control circuit (not shown) for generating reset data during a reset condition. In one embodiment, reset data may be generated by connecting SDI_IN to a logic 0 and shifting the reset data into the scan chain by normal scan shifting means during a reset condition. In other embodiments, the data control circuit may contain, or be connected to, memory elements which store the reset data that is to be shifted into the scan chain. Reset control 110 also receives CLK 70 through clock control circuit 130 via 125 and toggles scan enable (SSE 60) synchronously with CLK 70 during reset conditions. Once a scan-based reset is complete, normal operation may continue.

Flops A 55, B 65, and C 75 may contain further optimizations. For example, it is not necessary that each flop have both a Q output and a SDO output, as each sources the same value stored in the flop. The Q output of each of these scan flops may connect directly to the SDI input of the next flop to form the scan chain, thus eliminating the need for the SDO circuitry. Moreover, in many designs, it is desirable to reset a particular flop to a logic 1 rather than a logic 0. An inverter may be inserted between the output of one flop and the input of the next flop to invert the reset data as it is being shifted into the scan chain. On the other side of the flop, an additional inverter may be provided to invert the reset data back to its original values for the rest of the chain. In this manner, Flop A 55 can be reset to a logic 0, Flop B 65 can be reset to a logic 1, and Flop C 75 can be reset to a logic 0 when the reset data is, for example, a stream of logic zeroes and inverters are placed on either side of Flop B 65.

Figure 4:
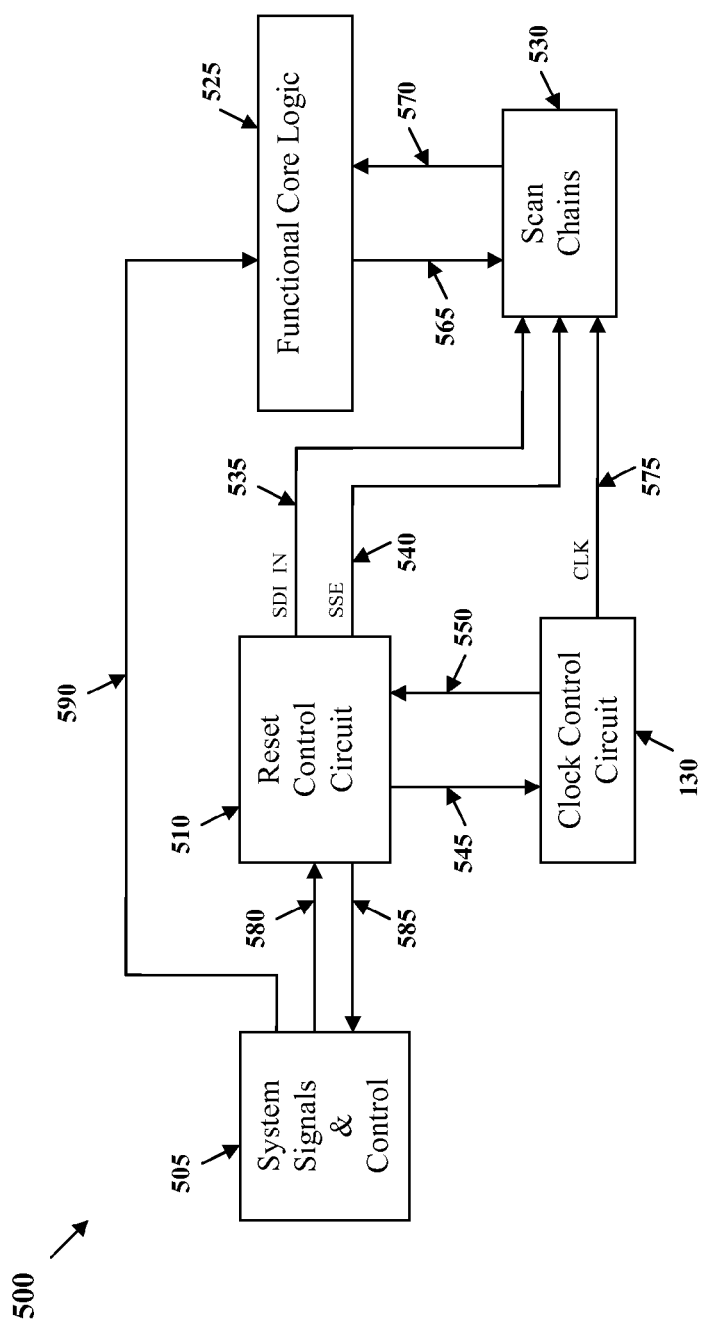
FIG. 4 is a block diagram of a microcircuit design in accordance with an embodiment of the invention.

FIG. 4 shows an exemplary embodiment of a microcircuit design that utilizes scan-based reset and further illustrates the functional aspects of scan-based reset in more detail. The microcircuit design includes core logic 525 that may comprise combinational logic, sequential logic, or any other type of logic that implements the functional aspects of the design. Scannable sequential elements are introduced into the core design at 530 and connect to reset control circuit 510, rather than a reset tree. The scannable control elements 530 may form one or more scan chains and comprise mux-d flops or any other type of suitable flop. Reset control circuit 510 controls the scannable elements 530 by connecting to the scan input 535 of the first scan cell of each scan chain and toggling the scan enable signal 540 during a reset condition. A clock control circuit 130 provides a clock 575 to the scan chains. Clock 575 can be the system clock or a divided form of the system clock to match a slower, optimized frequency of the scan chains 530. System control 505 sources one or more system signals 580, such as a power-on reset or the completion of a MBIST, to notify reset control 510 that a reset condition has occurred. Reset control 510 initiates reset of the scan chains in response to the signals and may communicate a reset complete 585 signal back to system control 505 when reset is complete.

Figure 5:
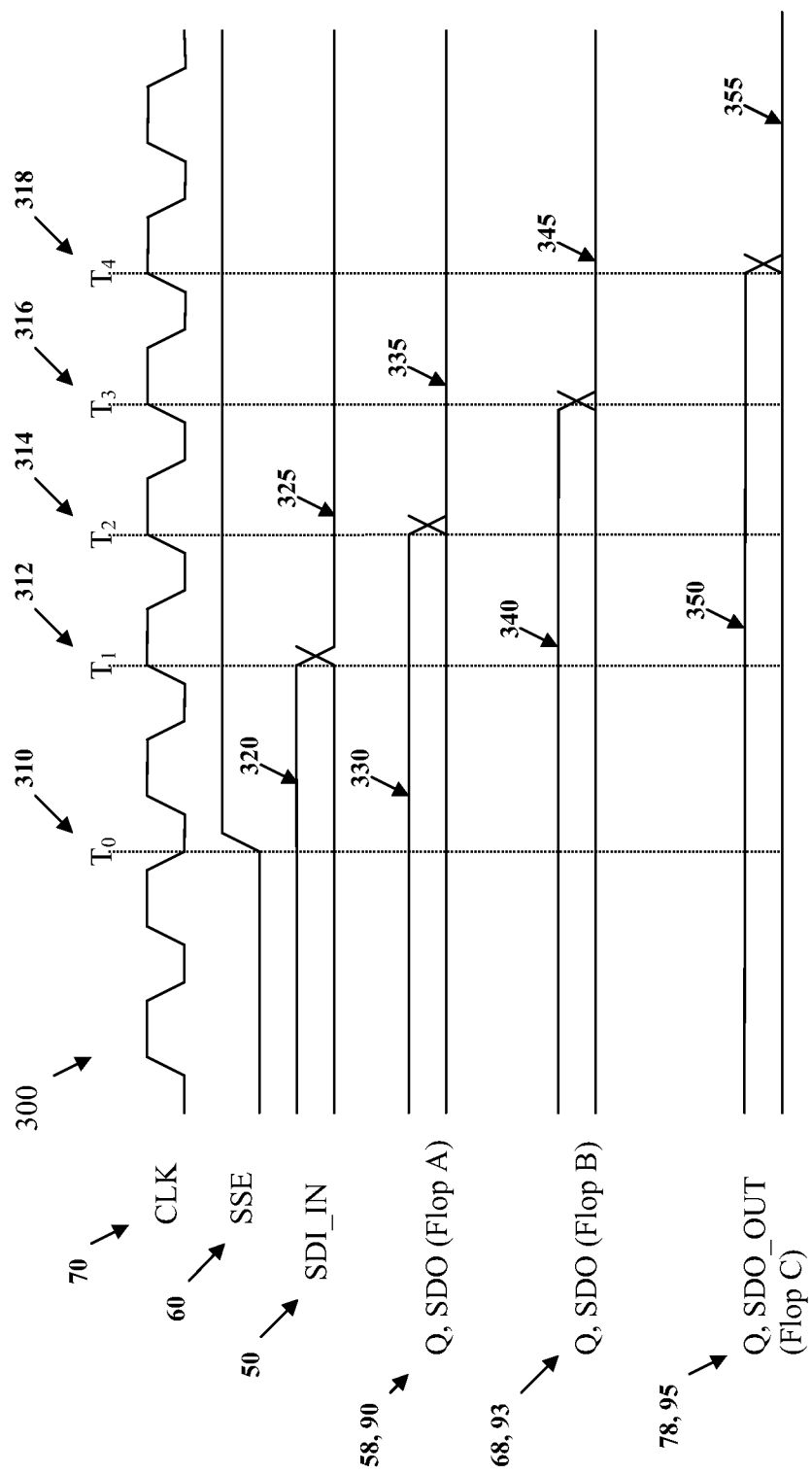
FIG. 5 is a simplified timing diagram showing a reset sequence in accordance with the embodiment of the invention shown in FIG. 3.

FIG. 5 is a simplified timing diagram showing the reset sequence of the scannable elements shown in FIG. 3. Once a reset condition is asserted, reset control 510 asserts SSE 60 at time $T_0$ 310 and SDI_IN 50 at $T_1$ 312. As discussed above, SDI_IN 50 may connect to a logic 0 or another data control circuit to provide the reset data to the scan chain. Upon the rising edge of CLK 70 at $T_2$ 314, outputs of Flop A 55 (i.e., Q 58 and SDO 90 in FIG. 3) transition to logic 0, as shown by 335. Upon each successive rising edge of CLK 70, e.g., $T_3$ 316 and $T_4$ 318, each subsequent scannable flop in the scan chain transitions to its reset state, as shown by 345 and 355, as the reset data is serially shifted through the scan chain.

Because scan chains are typically optimized for slower clock frequencies than the functional logic, scan-based reset may require adjustment of the system clock speeds. For large circuit designs that may have many scan chains configured for scan-based reset, it may be more efficient to control the system clock at the source of the system clock tree than it would be to divide the system clock at each scan chain. In one embodiment, clock control circuit 130 controls the frequency of the system clock that is fanned out to each scan chain. In another embodiment, clock control circuit 130 divides the system clock that is supplied to at least one scan chain. In either case, a series of handshake signals between system control 505, reset control 510, and clock control 130 may control the clock frequency changes.

Referring to FIG. 4, when reset control 510 senses a reset condition, such as a power-on reset or the completion of a MBIST, for example, it sends a reset request 545 to clock control circuit 130. Clock control 130 is designed to change the system clock speed upon receipt of the request 545. Clock control circuit 130 contains control logic to remember the current system clock frequency setting, begins ramping down the system clock speed to the appropriate target setting by, for example, dividing the current system clock, and sends an acknowledgement 550 back to reset control 510 once the target frequency has been reached. Reset control 510 may then begin scan-based reset. Once scan-based reset is complete, reset control 510 removes request 545, and clock control circuit 130 begins ramping up the clock speed to its previous setting. When the previous setting is reached, clock control 130 de-asserts its acknowledgement 560. Reset control 510 may then inform system control 505 that the reset sequence is complete by asserting a reset complete 585 signal to system control 505. Normal system operation may then continue.

Figure 6:
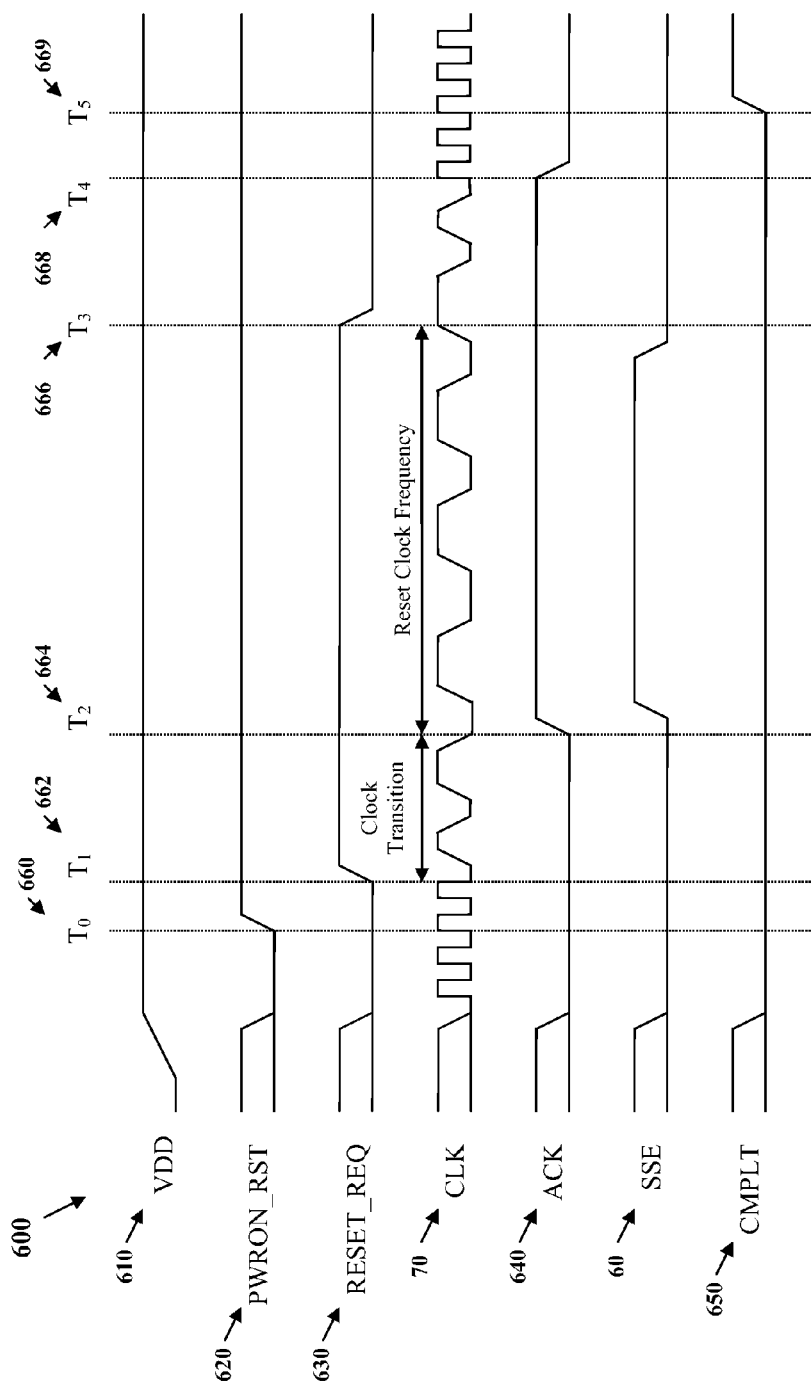
FIG. 6 is a simplified timing diagram illustrating adjustment of a system clock upon assertion of a reset condition in accordance with an embodiment of the invention.

The timing and operation of the handshake signals are further described by reference to FIG. 4 and FIG. 6. VDD 610 (FIG. 6) represents the system voltage applied to a microcircuit. When power is applied, VDD 610 ramps up to its specified level. Once obtained, system control 505 sources PWRON_RST 620 to reset control 510, shown at $T_0$ 660. PWRON_RST indicates that a power-on reset condition is present. Reset control 510 then initiates a reset sequence by requesting transition of the system clock to a reset clock frequency. This is done by asserting RESET_REQ 630, shown at $T_1$ 662, to clock control 130. Clock control begins transitioning the clock speed from the current clock speed to the reset clock speed by the means described above. The transitioning occurs between $T_1$ 662 and $T_2$ 664. When the reset clock speed is reached, clock control 130 asserts ACK 640 to reset control 510, indicated at $T_2$ 664, whereupon reset control 510 begins shifting reset data into the scan chain by toggling SSE 60, shown following $T_2$. Once the required number of bits have been shifted into the scan chain, reset control 510 deactivates RESET_REQ 630, shown at $T_3$ 666, informing clock control 130 that scan reset is complete and that the previous system clock speed should be restored. Clock control 130 transitions the clock back to the previous clock speed, as shown between $T_3$ 666 to $T_4$ 668. When the previous clock speed has been reached, clock control 130 deactivates ACK 640, shown at $T_4$ 668, informing reset control 510 that the previous clock speed has been restored. Reset control then informs system control 505 that the reset sequence is complete by asserting CMPLT 650. System control 505 may begin or return to normal system operation following receipt of CMPLT 650.

The timing and control sequence for other reset conditions, such as following an MBIST, are similar. System control 505 asserts a reset signal to reset control 510, and the sequence described above is repeated. Upon completion of the reset sequence, reset control 510 returns a corresponding handshake signal to system control 505. System control may then return to normal operation.

The scannable sequential elements described herein may be formed on a semiconductor material by any known means in the art. Forming can be done, for example, by growing or deposition, or by any other means known in the art. Different kinds of hardware descriptive languages (HDL) may be used in the process of designing and manufacturing microcircuit devices. Examples include VHDL and Verilog/Verilog-XL. In one embodiment, the HDL code (e.g., register transfer level (RTL) code/data) may be used to generate GDS data, GDSII data and the like. GDSII data, for example, is a descriptive file format and may be used in different embodiments to represent a three-dimensional model of a semiconductor product or device. Such models may be used by semiconductor manufacturing facilities to create semiconductor products and/or devices. The GDSII data may be stored as a database or other program storage structure. This data may also be stored on a computer readable storage device (e.g., data storage units, RAMs, compact discs, DVDs, solid state storage and the like) and, in one embodiment, may be used to configure a manufacturing facility (e.g., through the use of mask works) to create devices capable of embodying various aspects of the instant invention. As understood by one or ordinary skill in the art, it may be programmed into a computer, processor or controller, which may then control, in whole or part, the operation of a semiconductor manufacturing facility (or fab) to create semiconductor products and devices. These tools may be used to construct the embodiments of the invention described herein.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. A method of resetting a semiconductor device comprising:
   sensing a reset condition; and
   shifting reset data for non-test operation of the semiconductor device through a scan chain in response to the reset condition, wherein each element of the scan chain comprises a scannable sequential element configured to receive only a data input, a scan input, a scan enable input, and a clock input, and the reset data is received by the scan input of one of the scannable sequential elements.

2. The method of claim 1, wherein shifting reset data comprises shifting reset data after shifting test data through the scan chain.

3. The method of claim 1, further comprising changing the frequency of the clock input supplied to the scan chain either before or after the reset data is shifted through the scan chain.

4. A method of fabricating a semiconductor device comprising:
   coupling two or more scannable sequential elements together to form a scan chain;
   coupling a data circuit to a scan input circuit of a scannable sequential element of the scan chain, the data circuit configured to supply reset data to the scan chain during a reset condition for non-test operation of the semiconductor device; and
   coupling a control circuit to the scan chain, wherein the control circuit is configured to control shifting of the reset data into the scan chain in response to the reset condition;
   wherein each scannable sequential element is configured to receive only a data input, a scan input, a scan enable input, and a clock input; the reset data is received by the scan input of one of the scannable sequential elements.

5. The method of claim 4, wherein the scannable sequential elements are mux-d flops.

6. The method of claim 5, wherein the data circuit is configured to supply reset data to the scan chain after test data has been shifted through the scan chain.

7. The method of claim 6 further comprising coupling a clock control circuit to the scan chain, the clock control circuit configured to adjust the frequency of the clock input supplied to the scan chain during the reset condition.

8. The method of claim 4, wherein each scannable sequential element comprises a mux-d flop and wherein the reset condition is a power-on reset.

9. The method of claim 4, further comprising coupling additional scannable sequential elements to form a second scan chain, the additional scannable sequential elements further coupled to the data and control circuits.

10. An apparatus comprising:
    two or more scannable sequential elements coupled to combinational logic and configured to form a scan chain, wherein each scannable sequential element is configured to receive only a data input, a scan input, a scan enable input, and a clock input; and
    a shift control circuit coupled to the two or more scannable sequential elements for shifting reset data for non-test operation of the apparatus into the scan chain in response to a reset condition, wherein the reset data is received by the scan input of one of the scannable sequential elements.

11. The apparatus of claim 10 further comprising a clock control circuit for controlling the clock input that is used to shift the reset data into the scan chain.

12. The apparatus of claim 11, wherein the clock control circuit is configured to adjust the frequency of the clock input used to shift the reset data into the scan chain.

13. The apparatus of claim 10, wherein the scannable sequential elements comprise mux-d flops.

14. The apparatus of claim 13, wherein the shift control circuit is to shift reset data into the scan chain after test data has been shifted into the scan chain.

15. The apparatus of claim 13, wherein the reset condition is a built-in self-test.

16. A non-transitory computer readable storage device encoded with data that, when implemented in a manufacturing facility, adapts the manufacturing facility to create an apparatus, comprising:
    two or more scannable sequential elements coupled to combinational logic and configured to form a scan chain, wherein each scannable sequential element is configured to receive only a data input, a scan input, a scan enable input, and a clock input; and
    a shift control circuit coupled to the two or more scannable sequential elements for shifting reset data for non-test operation of the apparatus into the scan chain in response to a reset condition, wherein the reset data is received by the scan input of one of the scannable sequential elements.

17. The computer readable storage device of claim 16, wherein the apparatus further comprises a clock control circuit for controlling the clock input that is used to shift the reset data into the scan chain.

18. The computer readable storage device of claim 17, wherein the clock control circuit is configured to adjust the frequency of the clock input used to shift the reset data into the scan chain.

19. The computer readable storage device of claim 16, wherein the scannable sequential elements comprise mux-d flops.

20. The computer readable storage device of claim 19, wherein the reset condition is a power-up reset.

21. The computer readable storage device of claim 19, wherein the reset condition is a built-in self-test.

22. The computer readable storage device of claim 16, wherein the apparatus further comprises a data control circuit coupled to the scan input of at least one of the scannable sequential elements of the scan chain for providing the reset data.

* * * * *